(12) United States Patent
Chai et al.

(10) Patent No.: US 6,551,869 B1
(45) Date of Patent: Apr. 22, 2003

(54) LATERAL PNP AND METHOD OF MANUFACTURE

(75) Inventors: Francis K. Chai, Gilbert, AZ (US); Vida Ilderem Burger, Phoenix, AZ (US); Carl S. Kyono, Tempe, AZ (US); Sharanda L. Bigelow, Chandler, AZ (US); Rainer Thoma, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/590,461

(22) Filed: Jun. 9, 2000

(51) Int. Cl.[7] .................... H01L 21/8238; H01L 27/082
(52) U.S. Cl. .................. 438/204; 438/236; 438/316; 438/325; 438/335; 257/557; 257/575
(58) Field of Search .................. 438/204, 236, 438/335, 316, 325; 257/557, 558, 575

(56) References Cited

U.S. PATENT DOCUMENTS

| | | | | |
|---|---|---|---|---|
| 3,919,005 A | * | 11/1975 | Schinella et al. | 438/339 |
| 4,005,470 A | * | 1/1977 | Tucci et al. | 257/575 |
| 4,115,797 A | * | 9/1978 | Hingarh et al. | 257/512 |
| 4,180,827 A | * | 12/1979 | Gates | 257/556 |
| 4,203,126 A | * | 5/1980 | Yim et al. | 257/375 |
| 4,458,158 A | * | 7/1984 | Mayrand | 326/101 |
| 4,484,388 A | * | 11/1984 | Iwasaki | 438/207 |
| 4,740,821 A | * | 4/1988 | Bertotti et al. | 257/273 |
| 4,956,305 A | * | 9/1990 | Arndt | 438/203 |
| 5,016,075 A | * | 5/1991 | Minato | 257/556 |
| 5,066,602 A | * | 11/1991 | Takemoto et al. | 438/203 |
| 5,302,534 A | * | 4/1994 | Monk et al. | 438/234 |
| 5,929,506 A | * | 7/1999 | Hutter et al. | 257/544 |
| 6,005,283 A | * | 12/1999 | Kim et al. | 257/557 |
| 6,034,413 A | * | 3/2000 | Hastings et al. | 257/575 |
| 2001/0000413 A1 | * | 4/2001 | Pinto et al. | 257/557 |

FOREIGN PATENT DOCUMENTS

JP          56081969 A   *  7/1981   ........... H01L/27/10

* cited by examiner

*Primary Examiner*—Eddie Lee
*Assistant Examiner*—José R. Díaz
(74) *Attorney, Agent, or Firm*—James L. Clingan, Jr.

(57) ABSTRACT

A lateral PNP is disclosed in which a substrate of a first conductivity type is used. On top of the substrate a buried region of a second conductivity type is formed. A lightly doped collector region is located above the buried region. The lateral PNP also includes a base region of a second conductivity type formed by a graded channel implant and a well region of a second conductivity type, the well region contacting the base region, the buried region and a base contact. Additionally, there are collector contacts and emitter contacts of a first conductivity type. The lightly doped collector region results in a large Early voltage and the base region provides for a high current gain.

14 Claims, 5 Drawing Sheets

LATERAL PNP AND METHOD OF MANUFACTURE

FIELD OF THE INVENTION

This invention relates to the field of integrated circuits and more specifically to a lateral bipolar transistor and a method of manufacture.

BACKGROUND OF THE INVENTION

The growth of the wireless communication market has lead to the demand for integrated circuits that are needed for high speed, high drive, mixed-voltage and analog-digital applications. These include products such as mixers, low noise amplifiers, voltage controlled oscillators, and also analog-to-digital and digital-to-analog converters, as well as synthesizers. This demand has lead to research for bipolar transistors such as lateral PNPs that can be produced in a cost-effective manner utilizing Bipolar-CMOS (BiCMOS) techniques.

Current standard sub-micron BiCMOS techniques are unable to build low-cost lateral PNPs. One reason is that standard BiCMOS technologies for making a lateral PNP is based upon the formation of a retrograde well underlying the base, collector and emitter region. This results in a device having an unsuitably low current gain due to the large base width and doping concentration. Additionally, the manufacture of lateral PNPs using conventional BiCMOS methods requires additional process steps above and beyond those required to make other devices. This leads to increased costs.

Attempts have been made to increase the current gain in lateral PNPs by using separate gate controls to turn on parasitic PMOS in the lateral PNP structure. However, this leads to a four terminal device and is difficult to use in most applications.

Thus, there is a need for a lateral PNP that has both a high current gain and can be manufactured without the addition of manufacturing steps.

BRIEF DESCRIPTION OF THE DRAWINGS

For a more complete understanding of the present invention and advantages thereof, reference is now made to the following descriptions, taken in conjunction with the following drawings, in which like reference numerals represent like parts, and in which.

DETAILED DESCRIPTION AND PREFERRED EMBODIMENT

Figure 1:
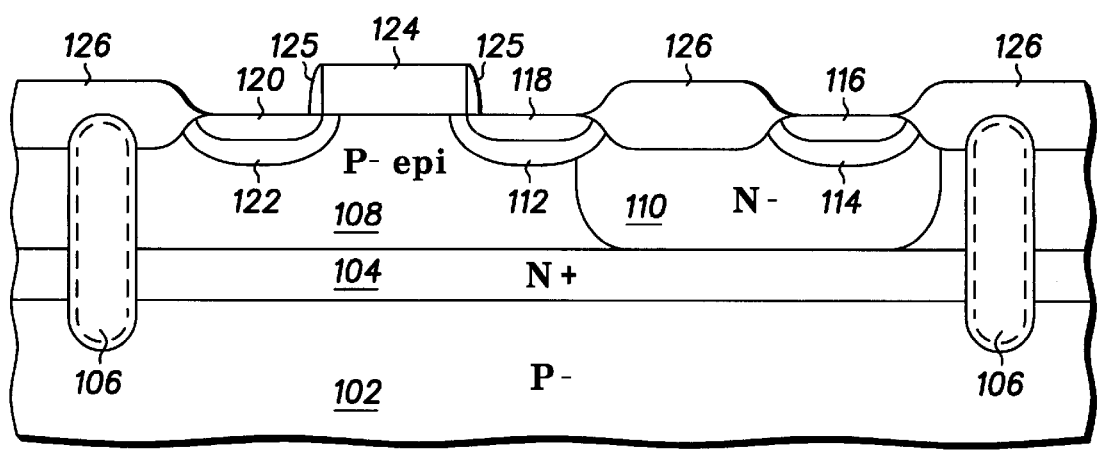
FIG. 1 is a cross section of a lateral PNP in accordance with the teachings of the present invention.

FIG. 1 illustrates a cross section of a lateral PNP 100 in accordance with the teachings of the present invention. It is understood that the drawings are for purposes of illustration only and are not to scale. Illustrated is substrate 102 having a first conductivity type (p-conductivity type). Above substrate 102 is buried layer 104 of a second conduction type (n-type conduction). Two deep trenches 106 are on either side of lateral PNP 100 to provide for isolation, and reduce collector-substrate capacitance.

Above buried layer 104 is a collector region 108 of p-type conduction. In one embodiment collector region 108 is a lightly doped p region formed as a p-epitaxial layer. This collector region gives the lateral PNP of the present invention an increased Early voltage (which leads to improved amplifier gains) as well as a decreased base/collector capacitance (enhancing circuit performance). Adjacent to collector 108 is an n-well 110. N-well 110 is operable to connect buried layer 104 to base region 112 and base contact 116. Base region 112 is formed by a low voltage (low $V_T$) n-type graded channel implant around a p-type implant formed as the emitter contact 118. The formation of the base region 112 around the emitter contact 118 is known as a halo implant. This type of base region 112 leads to a high lateral PNP current gain compared to conventional lateral PNP due to the proper combination of base width and base doping.

Collector contact 120 is surrounded by a p-type conduction region 122 implanted as a graded channel implant (and is also a halo implant). The p-type graded channel region 122 helps to reduce the Kirk effect by increasing the doping in the collector region. An n-type conduction region 114 is implanted around the base contact 116 as a halo implant. This increases the doping near the base contact 116 and leads to increased conductivity. Also included is a poly-silicon gate 124 with spacer 125. Field oxide layer 126 provides for isolation between active regions where the collector contact 120, the emitter contact 118, base contact 116 and gate 124 are formed.

Thus, lateral PNP 100 of the present invention exhibits an increased Early voltage due to the lightly doped p collector region and has a narrow base width due to the n-type graded channel implant for base region 112, which improves the current gain over prior designs. This improved lateral PNP overcomes the disadvantages of other lateral PNPs.

Figure 2:
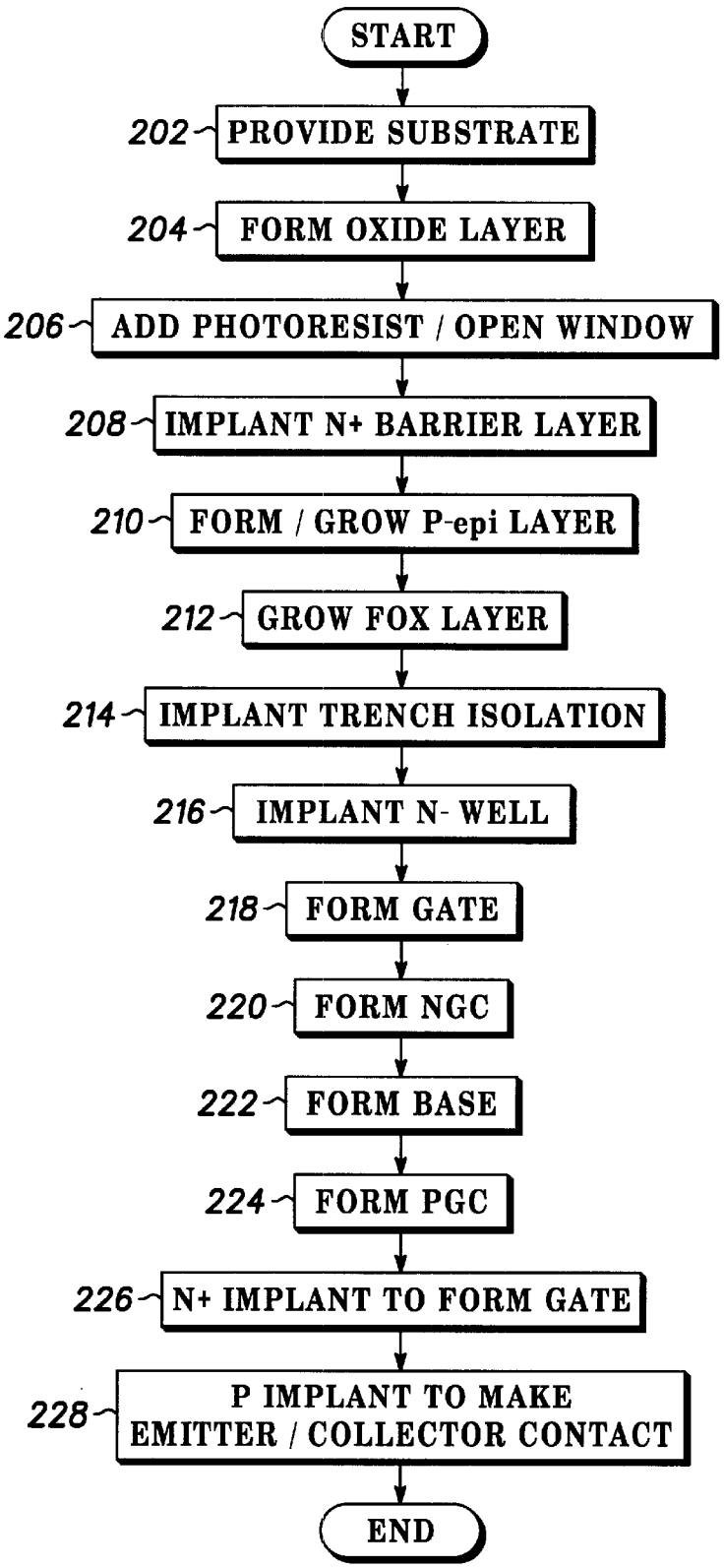
FIG. 2 is a flow chart illustrating a method of manufacturing a lateral PNP in accordance with the teaching of the present invention.

FIG. 2 is a flow chart illustrating a method of manufacturing a lateral PNP in accordance with the teachings of the present invention. The method will discuss the manufacture of a lateral PNP. While the lateral PNP is formed, other components are manufactured, such as NMOS and/or PMOS may be formed simultaneously on the same substrate. In the present invention, the lateral PNP is formed without adding additional process steps to those required to make the other devices. Therefore, no additional masks are needed for photolithography, resulting in a cost-effective process.

Figure 3:
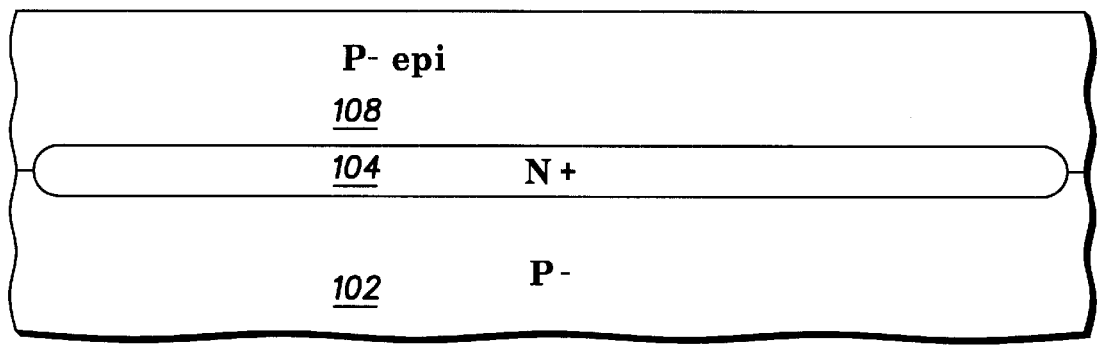
FIGS. 3–12 are cross sectional views of a lateral PNP viewed at different stages of manufacture.

In step 202, a suitable substrate is provided. In an embodiment of the present invention, the substrate will be of p conductivity type. In step 204, an oxidation layer is applied. In one embodiment, this oxidation layer is approximately 200 angstroms in thickness. Then, photoresist is deposited and, using conventional photolithography techniques, windows are opened for implanting dopants, in step 206. In step 208, an n-type implant is done. This implant is done using arsenic as the n-type dopant and it is used to form a n+ buried layer, which extends into the substrate. This buried layer is then subject to an annealing step, which causes it to extend further into the substrate. In step 210, a pre-epitaxial oxide strip is added and, using various heat cycles, a lightly-doped p epitaxial layer is grown over the p substrate with the n-type buried layer extending into both the p epitaxial layer and the p substrate. FIG. 3 illustrates this stage in the manufacturing. Buried layer 104 lies between the p epitaxial layer 108 and substrate 102. Buried layer 104 isolates the p epitaxial layer 108 from the substrate 102.

Figure 4:
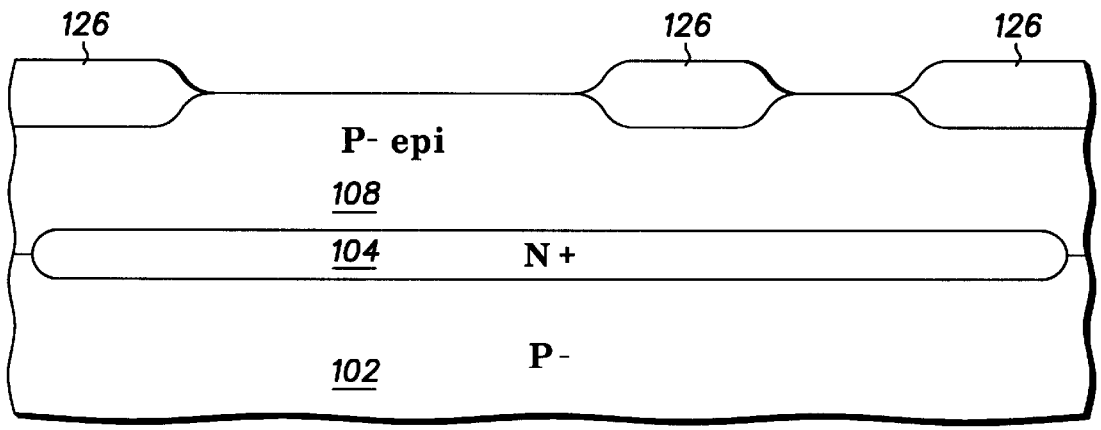

Next, in step 212, a field oxide layer is grown over the p epitaxial layer in every place except where device contacts and gates will be built. The field oxide layer, which is a layer of silicon dioxide, is grown in the conventional manner. In one embodiment, the field oxide layer is formed as follows. A layer of nitride of about 1400 angstroms is deposited over the oxidation layer and then standard photolithography techniques are used to open up windows to allow for the etching of both the nitride layer and the oxide layer. Then, the photoresist is stripped and the oxide layer is undercut under some of the nitride layer. Next, a layer of poly-silicon of about 300 angstroms in thickness is deposited as amorphous silicon. Then this is allowed to form into a field oxide layer 126 of about 6,750 angstroms in all areas except for where contacts and the gate will be formed. This is needed for the isolation between active regions where the contact and gates will be formed. This structure is illustrated in FIG. 4.

Figure 5:
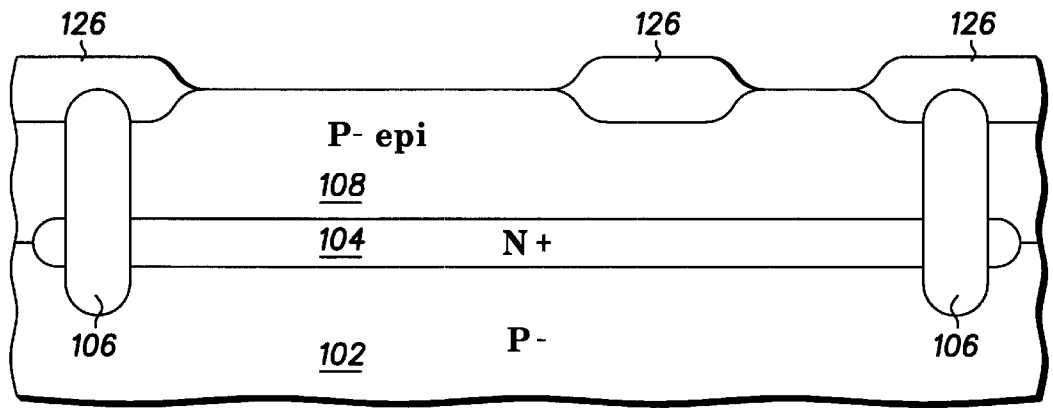

In step 214, deep trenches 106 are added. The deep trenches provide isolation and cut parasitic capacitances. In one embodiment, the trenches are formed as follows. Photolithography techniques are used to open small windows in a photoresist. Then a trench is chemically etched. Channel stop implants such as boron are added to the bottom of the trench to stop parasitic MOSFETs from turning on and the rest of the trench is filled with poly-silicon. This structure is illustrated in FIG. 5.

Figure 6:
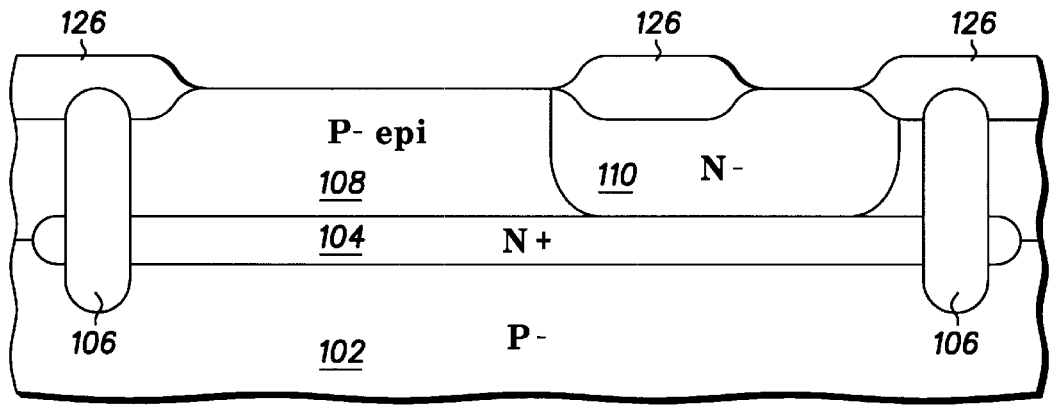

After the trenches are formed, an n-well 110 is formed by the implantation of phosphorous in step 216. This is accomplished by first applying a photoresist and then using photolithography techniques, forming an opening over the area where the n-well is to be established. Then a chain implant of phosphorous is done. A chain implant is a series of implants done at different energies and is well known in the art. This allows for a deep, middle and surface implantation of phosphorous. The n-well is added in such a fashion that it extends to and touches the buried layer. After the implantation, all of the photoresist is stripped. In a conventional lateral PNP, the n-well extends through the p-epitaxial layer, resulting in a large base width. This results in a small current gain. In the present invention, the n-well serves to connect the base to the buried layer and base contact so it does not effect the current gain. This structure is illustrated in FIG. 6.

Figure 7:
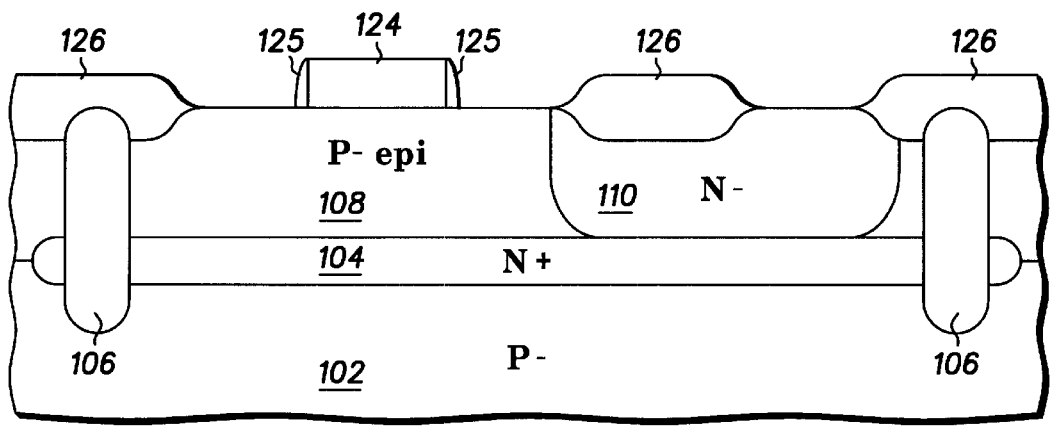

In step 218, a poly-silicon gate 124 is formed. This is done by first coating with a layer of poly-silicon over a thin oxide. Then, a thin layer of nitride is added. Photoresist is added on top of the layer of nitride and, using conventional photolithography techniques, it is stripped in every area except where the gate is to be formed. Everything not covered by photoresist is then stripped to the gate oxide layer. The resist is then removed leaving the poly-silicon gate formed in the correct area. Spacers 125 are formed either side of gate 124 in a step not pictured but well known in the art. This structure is illustrated in FIG. 7.

Figure 8:
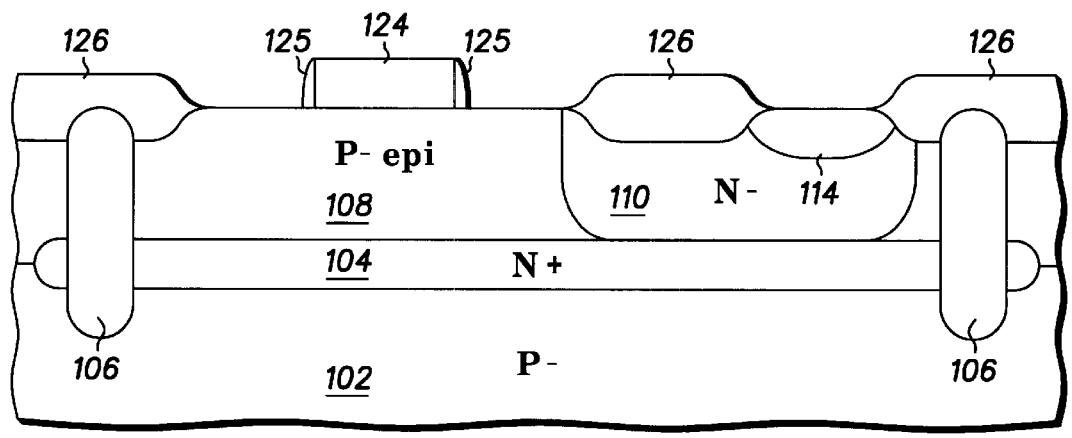

In step 220, an n-type graded channel region 114 is added. This is done by first covering all areas with photoresist and then removing photoresist from the area where the implantation is to occur. Then, a phosphorous implantation is done to give an n-type region. This implantation is done is such a way as to leave a laterally non-uniform doping in that region which is known as a graded channel region. This will increase the n-type doping under the base contact, which will increase conductivity. This structure is illustrated in FIG. 8.

Figure 9:
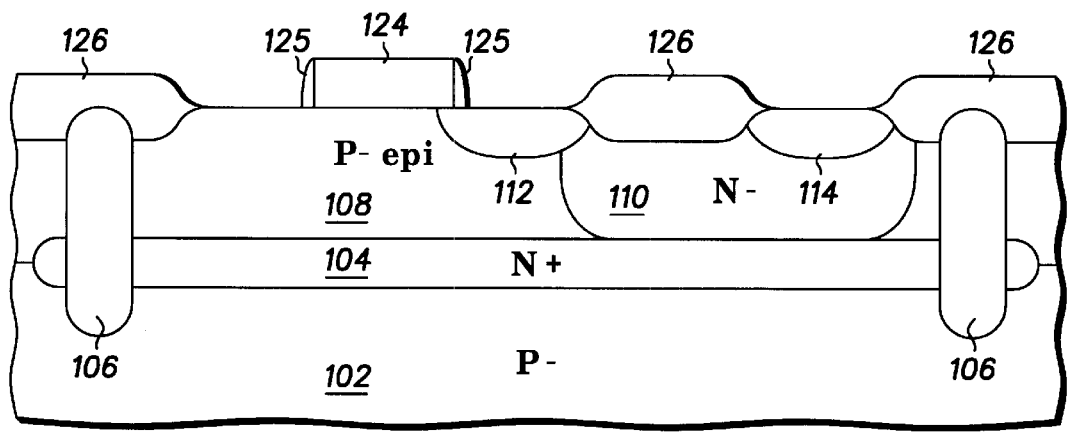

In step 222, the base region 112 is formed. It is formed in a similar way as the n-type graded channel region, which overlies the n-well. An implantation of phosphorous is done using a low threshold voltage dose to form a lightly doped n-type graded channel as the base. After diffusion, this base region will contact the n-well which will, in turn, contact the region formed in step 220, which is in contact with the base contact as depicted in FIG. 1. The advantage of this base region is that it allows for a larger current gain over conventional lateral PNPs due to the reduced base width and the proper doping. This is illustrated in FIG. 9.

Figure 10:
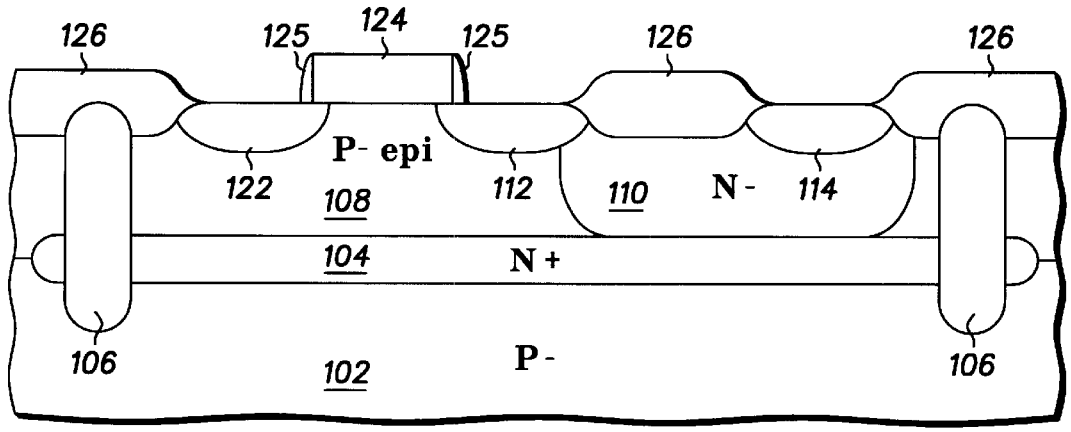

In step 224, a p-type graded channel region 122 is added. This will be formed in the area where the collector contact will be located. This is done in a similar fashion as in steps 220 and 222. In this case, the dopant added is boron to form a p-type conductivity region. This p-type graded channel region helps to reduce the Kirk effect. Again, this is illustrated in FIG. 10.

Figure 11:
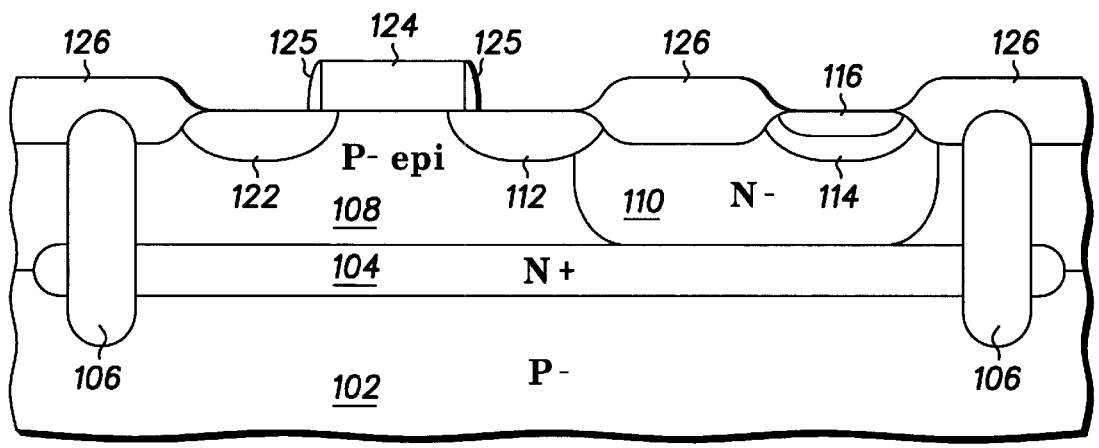
Figure 12:
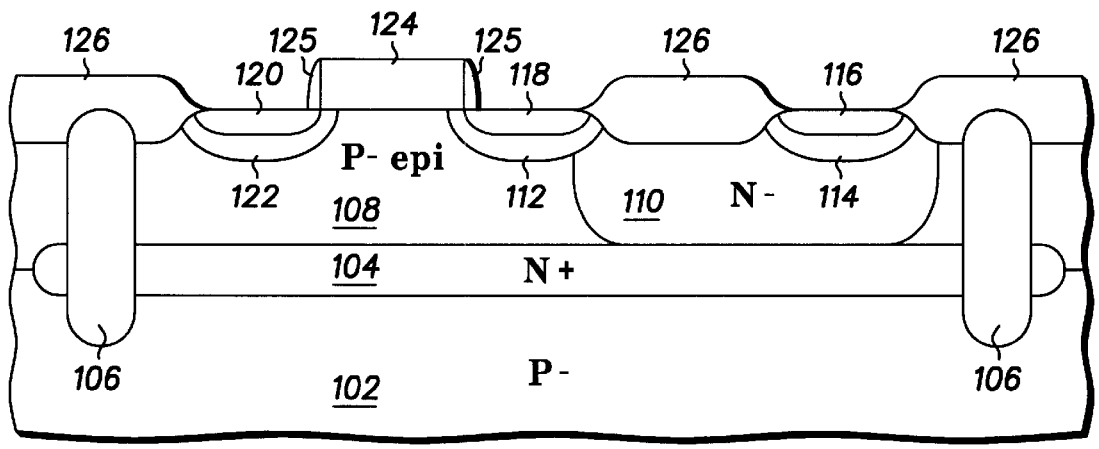

In the next step, step 226, dual n-type implants will be done—one at the gate region and the other where the n-type graded channel region in the base contact 116 is located. This forms an n-type poly-silicon gate region and forms an n-type base contact 116. See FIG. 11. Finally, in step 228, a p-type implant is done to form the collector 120 and emitter 118 contacts. This final step is illustrated as FIG. 12.

Thus, a cost effective method has been provided that can be used to manufacture a lateral PNP having the advantages of a higher Early voltage and an improved current gain compared to lateral PNPs of conventional topology. While process steps have been given in order, it would be obvious to one skilled in the art to alter the order of the steps.

What is claimed is:

1. A method for manufacturing a lateral PNP comprising:
   providing a substrate layer of a first conductivity type;
   forming a lightly doped collector region of a first conductivity using a p epitaxial layer,
   forming a buried layer of a second conductivity type between the substrate layer and the collector region;
   forming an n-well;
   forming a base region such that the base region contacts the buried layer, n-well and a base contact; and
   forming an emitter contact and a collector contact.

2. The method of claim 1, wherein the step of forming an n-well comprises using a chain implant to form an n-well region.

3. The method of claim 1, further comprising forming a gate.

4. The method of claim 1, wherein the step of forming a base region further comprises using a low voltage implant to form a graded channel base region.

5. The method of claim 1, further comprising forming deep trenches for isolation.

6. A method for manufacturing a lateral PNP comprising:
   providing a substrate layer of a first conductivity type;
   forming a collector region of a first conductivity using a p epitaxial layer,
   forming a buried layer of a second conductivity type between the substrate layer and the collector region;
   forming an n-well;
   forming a graded channel base region using a lightly doped implant such that the base region contacts the buried layer, n-well and a base contact; and
   forming an emitter contact and a collector contact.

7. The method of claim 6, wherein the step of forming an n-well comprises using a chain implant to form an n-well region.

8. The method of claim 6, further comprising forming a gate.

9. The method of claim 6, further comprising the step of forming deep trenches for isolation.

10. A lateral PNP produced by:
   providing a substrate layer of a first conductivity type;
   forming a lightly doped collector region of a first conductivity using a p epitaxial layer;
   forming a buried layer of a second conductivity type between the substrate layer and the collector region;
   forming an n-well;
   forming a graded channel base region using a lightly doped implant such that the base region contacts the buried layer, the n-well and a base contact; and
   forming an emitter contact and a collector contact.

11. The lateral PNP of claim 10, wherein the step of forming an n-well comprises using a chain implant to form an n-well region.

12. The lateral PNP of claim 10, further comprising forming a gate.

13. The lateral PNP of claim 10, wherein the step of forming a base region further comprises using a low voltage implant to form a graded channel base region.

14. The lateral PNP of claim 10, further produced by forming deep trenches for isolation.

* * * * *